(12) United States Patent
Beach et al.

(10) Patent No.: US 7,323,751 B2
(45) Date of Patent: Jan. 29, 2008

(54) THIN FILM RESISTOR INTEGRATION IN A DUAL DAMASCENE STRUCTURE

(75) Inventors: Eric Williams Beach, Tucson, AZ (US); Rajneesh Jaiswal, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/453,701

(22) Filed: Jun. 3, 2003

(65) Prior Publication Data

US 2004/0245575 A1 Dec. 9, 2004

(51) Int. Cl.
H01L 29/72 (2006.01)

(52) U.S. Cl. .................. 257/359; 257/380; 257/536; 257/537; 438/383; 438/384; 438/618; 438/622; 438/638

(58) Field of Classification Search .............. 257/347, 257/350–351, 357–360, 363, 758, 536–538, 257/380, E23.145, E21.495, E21.351, E29.176, 257/E27.047; 438/152, 155, 156, 309, 311, 438/622, 384, 618, 383, 638
See application file for complete search history.

(56) References Cited

U.S. PATENT DOCUMENTS

| | | | |
|---|---|---|---|
| 3,996,551 A * | 12/1976 | Croson .................... 338/309 |
| 5,043,295 A * | 8/1991 | Ruggerio et al. ............. 437/47 |
| 5,783,843 A * | 7/1998 | Lin ............................. 257/66 |
| 5,856,702 A * | 1/1999 | Hashimoto ................. 257/338 |
| 6,207,560 B1 | 3/2001 | Lee |
| 6,211,032 B1 * | 4/2001 | Redford et al. ............. 438/384 |
| 6,228,735 B1 | 5/2001 | Lee |
| 6,365,480 B1 * | 4/2002 | Huppert et al. ............ 438/381 |
| 6,365,498 B1 | 4/2002 | Chu et al. |
| 6,426,268 B1 * | 7/2002 | Huppert et al. ............ 438/384 |
| 6,534,374 B2 | 3/2003 | Johnson et al. |
| 6,582,974 B2 * | 6/2003 | Lui et al. ....................... 438/6 |
| 6,607,962 B2 * | 8/2003 | Zekeriya et al. ............ 438/384 |
| 6,645,821 B2 * | 11/2003 | Bailey et al. ............... 438/382 |
| 6,703,666 B1 * | 3/2004 | Huttemann et al. ......... 257/359 |
| 6,734,076 B1 * | 5/2004 | Jaiswal et al. ............. 438/384 |
| 6,756,321 B2 * | 6/2004 | Ko et al. .................... 438/778 |
| 6,921,962 B1 * | 7/2005 | Bailey et al. ............... 257/537 |
| 2002/0187629 A1 * | 12/2002 | Huang et al. ............... 438/624 |

* cited by examiner

*Primary Examiner*—Edward Wojciechowicz
(74) *Attorney, Agent, or Firm*—Wade James Brady, III; Frederick J. Telecky, Jr.

(57) ABSTRACT

A thin film resistor and at least one metal interconnect are formed in an integrated circuit. A first dielectric layer is formed over a metal interconnect layer. A thin film resistor is formed on the first dielectric layer and a second dielectric layer formed over the thin film resistor. Thin film resistor vias and the at least one trench are formed concurrently in the second dielectric layer. A trench via is then formed in the at least one trench. The trench via, the at least one trench and the thin film resistor vias are filled with a contact material layer to form thin film resistor contacts and at least one conductive line coupled to the metal interconnect layer.

14 Claims, 6 Drawing Sheets

THIN FILM RESISTOR INTEGRATION IN A DUAL DAMASCENE STRUCTURE

TECHNICAL FIELD

The present invention relates to semiconductor devices and, more particularly, to thin film resistor integration in a dual damascene structure.

BACKGROUND OF THE INVENTION

In the semiconductor industry, there is a continuing trend toward higher device densities. To achieve these high densities, there has been and continues to be efforts toward scaling down device dimensions to submicron levels (e.g., below 0.35 microns) on semiconductor substrates. In order to accomplish such high device packing density, smaller and smaller features sizes are required. This may include the width and spacing of metal interconnecting lines, spacing and diameter of contact holes, and the surface geometry such as corners and edges of various features. Conventionally, analog precision and mixed signal devices have not been fabricated employing these submicron densities. This is because the precision of the analog devices and the selection of available materials for precision analog devices have been overriding factors over device density and device speed. However, with the increased importance of reduced size and increased speeds in analog applications, and the increased integration of digital and analog devices in substrates, there is an increased desired to employ analog devices in submicron processes.

Conventionally, doped polysilicon is employed as a material of a resistor in a semiconductor fabrication. However, the resistance of a doped polysilicon resistor is controlled by the size of the predetermined length and area of the doped polysilicon layer. Therefore, to increase the resistance per unit of a resistor, thin film resistor materials are employed such as silicon chromium (SiCr) alloy, nickel chromium (NiCr) alloy, tantalum nitride, titanium nitride, and tungsten. Thin film resistors are very attractive components for high precision analog and mixed signal applications. In addition to a low thermal coefficient of resistance and low voltage coefficient of resistance, thin film resistors provide good resistor matching and good stability under stress.

High frequency mixed signal applications require the use of metal interconnects. Integrated circuit metal interconnects are formed using damascene processes. In a damascene process a trench is first formed in a dielectric layer. The trench is then filled with metal and the excess metal is removed by a number of different techniques, including chemical mechanical polishing.

The formation of thin film resistors in an integrated circuit containing metal interconnects presents many challenges. The thin film resistor is not formed using metal interconnect material and, therefore, is incompatible with existing damascene processes. The incompatibility is exacerbated by the requirement that the thin film resistors be formed in the same levels as the metal interconnects.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to integrating a thin film resistor into an integrated circuit comprising at least one metal interconnect. In one aspect of the invention, a method is provided for forming a thin film resistor. The method includes forming a first dielectric layer over a metal interconnect layer. The metal interconnect layer can reside over a semiconductor substrate or a number of intervening layers residing over a semiconductor substrate. A thin film resistor is formed on the first dielectric layer and a second dielectric layer formed over the thin film resistor. Thin film resistor vias and at least one trench are formed concurrently in the second dielectric layer. A trench via is then formed in the at least one trench to provide contact between the trench and the metal interconnect layer. The trench via, the at least one trench and the thin film resistor vias are filled with a contact material layer.

In another aspect of the invention, a method is provided for forming a thin film resistor and conductive lines in an integrated circuit. The method includes forming a thin film resistor material layer on a first dielectric layer overlying a metal interconnect layer, and etching away portions of the thin film resistor material layer to form a thin film resistor. An etch stop layer is then formed over the thin film resistor and a second dielectric layer formed over the etch stop layer. The second dielectric layer is etched to the etch stop layer concurrently forming at least one trench and thin film resistor vias in the second dielectric layer. The etch stop layer is then etched to expose portions of the first dielectric layer under the at least one trench. Etching of the stop layer also removes the etch stop layer to expose end portions of the thin film resistor. The thin film resistor vias, the at least one trench and the trench via are filed with a contact material layer, and polished back to remove an amount of the contact material layer overlying the second dielectric layer.

In yet another aspect of the present invention, an integrated circuit is providing having at least one thin film resistor and at least one conductive line coupled to a metal interconnect layer. The integrated circuit comprises a first dielectric layer disposed over a metal interconnect layer. A thin film resistor is disposed over the first dielectric layer, and a second dielectric layer is disposed over the thin film resistor. A first thin film resistor contact extends from a surface of the second dielectric layer to a first end of the thin film resistor and a second thin film resistor contact extends from a surface of the second dielectric layer to a second end of the thin film resistor. A trench contact extends from the metal interconnect layer to a surface of the first dielectric layer. A trench filled conductive line is coupled to the trench contact. The trench filled conductive line extends from the surface of the second dielectric layer to the surface of the first dielectric layer, wherein openings for the trench filled conductive line and the first and second thin film resistor contacts are formed concurrently.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to the formation of a thin film resistor during the formation of conductive interconnects in an integrated circuit. While the following description of the present invention is illustrated with respect to the structure shown in FIGS. 1-18, the present invention can be utilized in many semiconductor device structures.

Figure 1:
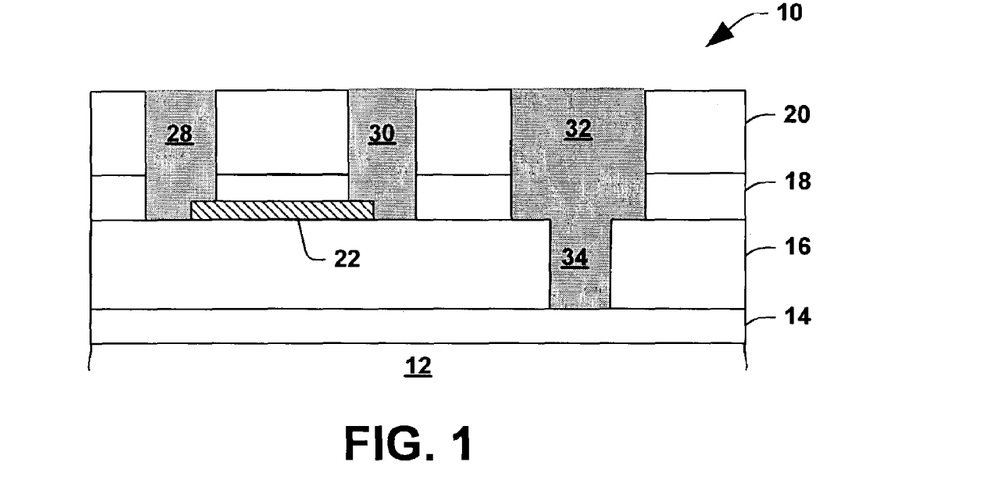
FIG. 1 illustrates a schematic cross-sectional view of an integrated circuit in accordance with an aspect of the present invention.

FIG. 1 illustrates an integrated circuit structure 10 including a thin film resistor (TFR) and dual damascene structure integrated therein in accordance with an aspect of the present invention. A metal interconnect layer 14 resides over a dielectric layer 12. The dielectric layer 12 can be formed over a semiconductor structure such as a semiconductor substrate and/or any number of intervening layers above a semiconductor substrate. The layers beneath the dielectric layer 12 can comprise any number of active devices including MOS and/or bipolar transistors as well as any number of metal interconnect levels.

An inter-level dielectric layer 16 resides over the metal interconnect layer 14. The inter-level dielectric layer 16 can comprise silicon oxide formed using any suitable method including chemical vapor deposition. A thin film resistor (TFR) 22 resides above the inter-level dielectric layer 16 and includes a first end coupled to a first TFR contact 28 and a second end coupled to a second TFR contact 30. The first TFR contact 28 and the second TFR contact 30 extend from the first and second ends of the TFR 22 to a top surface of a dielectric layer 20. A conductive line 32 extends through the dielectric layer 20 from the top surface of the dielectric layer 20, and is coupled to the metal interconnect layer 14 through one or more contacts 34 that extend from the top surface of the dielectric layer 16 to the metal interconnect layer 14. The conductive line and contacts are formed employing a dual damascene process. The TFR is fabricated concurrently with the conductive lines and contacts during the dual damascene process.

Figure 2:
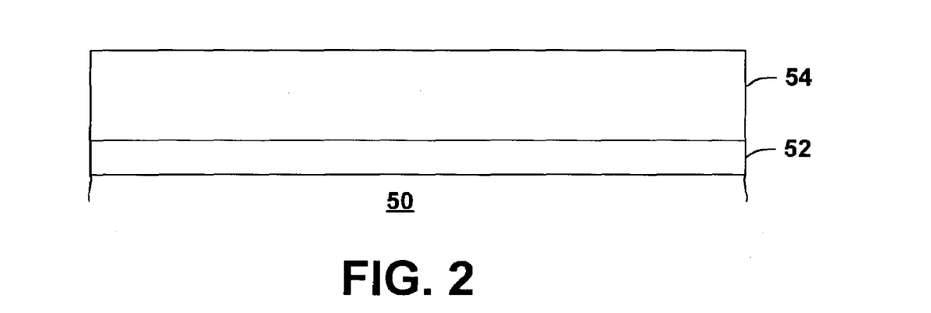
FIG. 2 illustrates a schematic cross-sectional view of a semiconductor structure having an inter-level dielectric layer formed over a metal interconnect layer in accordance with an aspect of the present invention.

FIGS. 2-18 illustrate a methodology of integrating the fabrication of a thin film resistor (TFR) with the fabrication of a dual damascene semiconductor device in accordance with an aspect of the present invention. FIG. 2 illustrates a metal interconnect 52 (e.g., aluminum, aluminum alloy, copper, copper alloy, tungsten, tungsten alloy) formed over a dielectric layer 50. The dielectric layer 50 can be formed over a semiconductor substrate and any number of intervening layers. The semiconductor and any intervening layers have been omitted from the Figures for clarity. Although omitted from the Figures, the layers beneath the dielectric layer 50 will comprise any number of active devices including MOS and/or bipolar transistors as well as any number of metal interconnect levels.

As illustrated in FIG. 2, an inter-level dielectric layer 54 is formed over the metal interconnect layer 52. The inter-level dielectric layer 54 can comprise silicon oxide formed using any suitable method including chemical vapor deposition Low Pressure Chemical Vapor Deposition (LPCVD), Plasma Enhanced Chemical Vapor Deposition (PECVD), High Density Plasma Chemical Vapor Deposition (HD-PCVD), Physical Vapor Deposition (PVD), Metal Organic Chemical Vapor Deposition (MOCVD), Pulsed Laser Deposition (PLD), Atomic Layer Deposition (ALD), various sputtering techniques and other film growth techniques. In one aspect of the present invention, the inter-level dielectric layer 54 is formed using at least one of TEOS silicon oxides, PECVD silicon oxides, silicon nitrides, silicon oxynitrides, silicon carbides, spin-on glass (SOG) such as silsesquioxanes and siloxane, xerogels or any other suitable material. In another aspect of the present invention, the thickness of the inter-level dielectric layer 54 is in the range from about 3000 Å to about 8000 Å, and the thickness of the metal interconnect layer 52 is in the range from about 3000 Å to about 5000 Å. The inter-level dielectric layer 54 can be planarized by a chemical mechanical polish (CMP).

Figure 3:
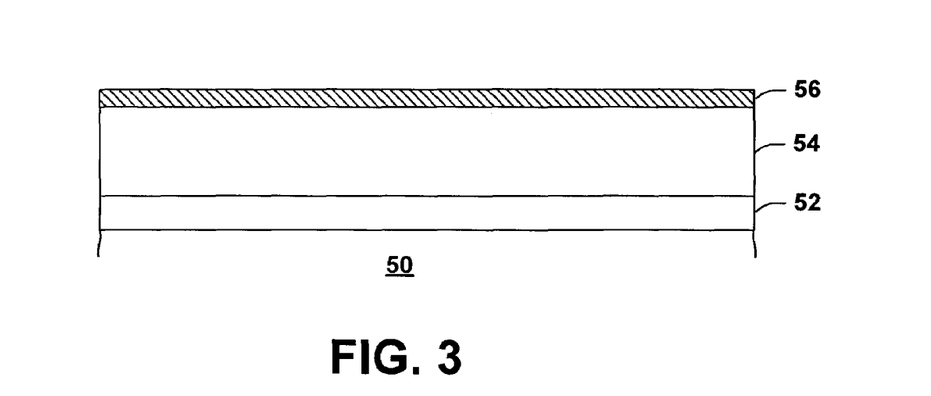
FIG. 3 illustrates a schematic cross-sectional view of the structure of FIG. 2 after deposition of a resistor material layer in accordance with an aspect of the present invention.
Figure 4:
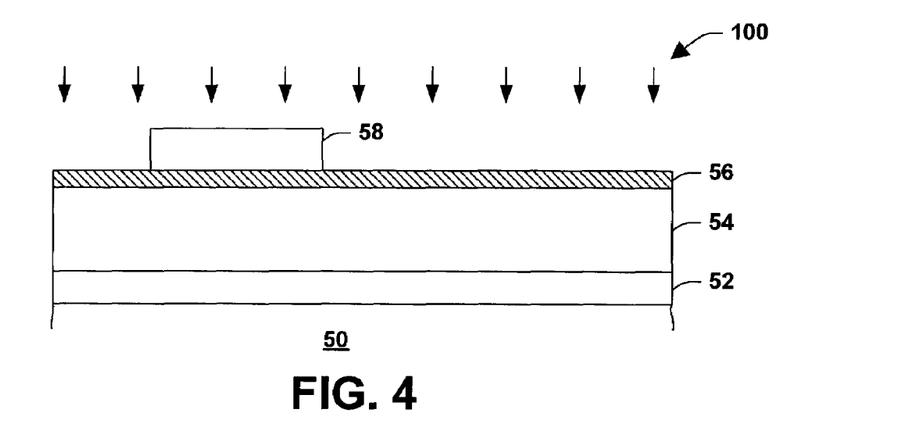
FIG. 4 illustrates a schematic cross-sectional view of the structure of FIG. 3 undergoing an etch step in accordance with an aspect of the present invention.

FIG. 3 illustrates the structure after a resistor material layer 56 is deposited over the inter-level dielectric layer 54.

The resistor material layer 56 can be formed using a silicon chromium (SiCr) alloy, nickel chromium (NiCr) alloy, tantalum nitride, titanium nitride, tungsten, or any other suitable resistor material. The resistor material can be selected based on a particular implementation and a desired result. Any suitable technique for forming the resistor material layer 56 can be employed such as Physical Vapor Deposition (PVD), Metal Organic Chemical Vapor Deposition (MOCVD), Pulsed Laser Deposition (PLD), Atomic Layer Deposition (ALD) and other film growth techniques. Alternatively, the resistor material layer 56 can be formed, employing Low Pressure Chemical Vapor Deposition (LPCVD), Plasma Enhanced Chemical Vapor Deposition (PECVD), High Density Plasma Chemical Vapor Deposition (HDPCVD), or various sputtering techniques, to a thickness suitable for forming a TFR. In one aspect of the present invention, the thickness of the resistor material layer 56 is in the range from about 25 Å to about 300 Å (e.g., 35 Å for a 1 Kohm silicon chromium resistor).

Figure 5:
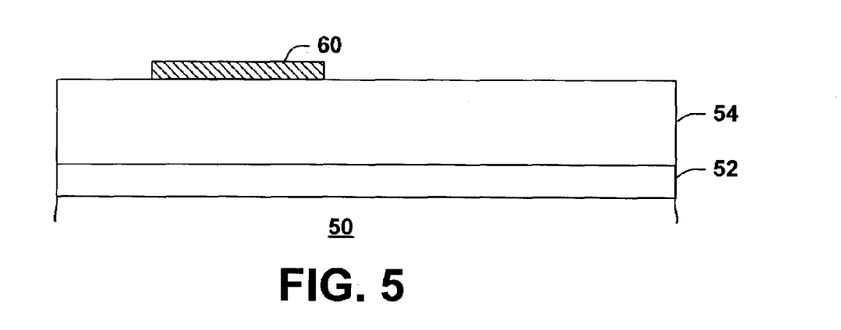
FIG. 5 illustrates a schematic cross-sectional view of the structure of FIG. 4 after the etch step is substantially complete in accordance with an aspect of the present invention.

A photoresist layer 58 (FIG. 4) is formed and patterned over the thin film resistor material layer 56 and is used to define a TFR during an etching process. An etch 100 is performed on the resistor material layer 56 to form TFR 60 (FIG. 5). The TFR 60 formed by etching the resistor material layer 56 using the photoresist layer 58 as a masking layer. The resistor material layer 56 can be etched using any suitable dry or wet etching process. A selective etch technique can be used to etch the material of the resistor material layer 56 at a relatively greater rate as compared to the rate that the material of the patterned photoresist 58 and the underlying inter-level dielectric layer 54 is etched. The resultant structure is illustrated in FIG. 5 after the remaining patterned photoresist 58 is stripped (e.g., ashing in an $O_2$ plasma).

Figure 6:
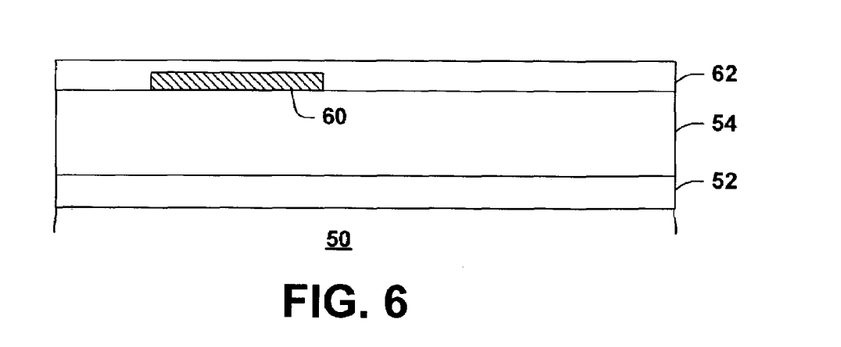
FIG. 6 illustrates a schematic cross-sectional illustration of the structure of FIG. 5 after deposition of a contact material layer in accordance with an aspect of the present invention.
Figure 7:
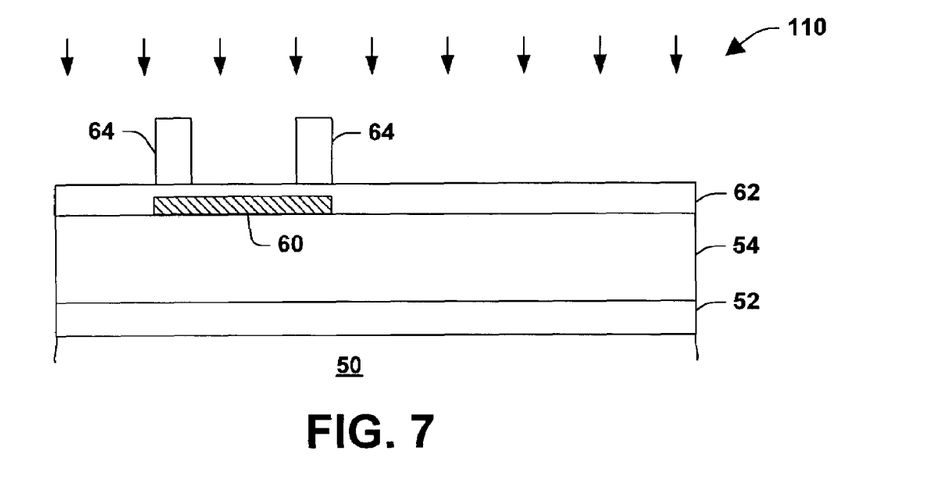
FIG. 7 illustrates a schematic cross-sectional illustration of the structure of FIG. 6 undergoing an etch step in accordance with an aspect of the present invention.

Following the formation of the TFR 60, a conductive contact layer 62 is formed over the TFR 60. The conductive contact layer 62 is employed to form contacts at a first end and a second end of the TFR 60. The contacts are provided to protect the TFR 60 from subsequent processing steps and are optional based on the particular resistor material of the TFR 60 in addition to the selection of subsequent etchants. The conductive contact layer 62 can be formed using titanium nitride, titanium tungsten, or any other suitable conductive material. It is to be appreciated that the conductive contact layer 62 can comprise multiple layers formed using layers comprised of the same or differing conductive material. Following the formation of the contact layer 62, a patterned photoresist 64 is formed over the conductive contact layer 62 as illustrated in FIG. 7, and is used to pattern the conductive contact layer 62 at a location above or near the ends of the TFR 60.

Figure 8:
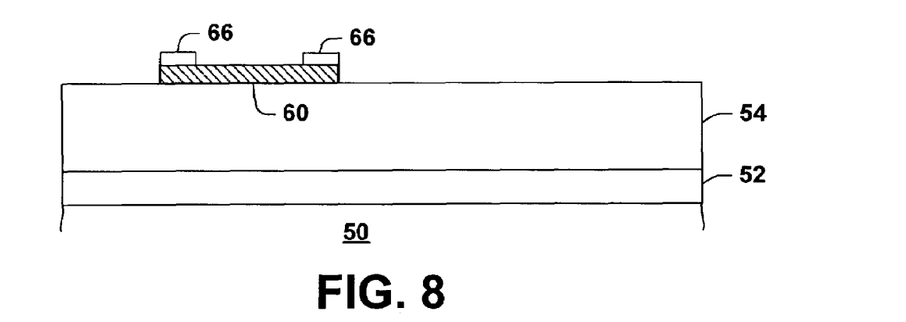
FIG. 8 illustrates a schematic cross-sectional illustration of the structure of FIG. 7 after the etch step is substantially complete in accordance with an aspect of the present invention.
Figure 9:
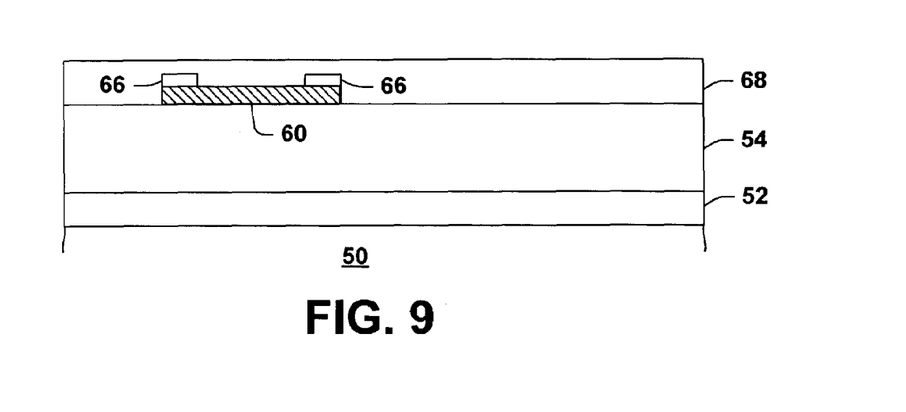
FIG. 9 illustrates a schematic cross-sectional illustration of the structure of FIG. 8 after deposition of an etch stop layer in accordance with an aspect of the present invention.

An etch 110 is performed on the conductive contact layer 62 to form contacts 66 (FIG. 8) at first and second ends of the TFR 60. The contacts 66 are formed by etching the contact layer 62 using the photoresist layer 64 shown in FIG. 7 as a masking layer. The contact layer 62 can be etched using any suitable dry or wet etching process. A selective etch technique can be used to etch the material of the conductive contact layer 62 at a relatively greater rate as compared to the rate that the material of the patterned photoresist 58 is etched. The selective etch technique can also etch the material of the conductive contact layer 62 at a greater rate than the TFR 60 and the underlying inter-level dielectric layer 54. With the etching of the conductive contact layer 62, contact pads 66 are formed as shown in FIG. 8. The contact pads 66 can protect the TFR 60 during the subsequent trench etch.

After the formation of the contact pads 66, an etch stop layer 68 (FIG. 9) is formed over the TFR 60 and the inter-level dielectric layer 54. The etch stop layer 68 can be formed of silicon nitride, silicon carbide, silicon oxynitride, or combinations of one or all of these and other suitable layers, and any other suitable dielectric material that can be employed as an etch stop layer. Any suitable technique for forming the etch stop layer 68 can be employed such as Physical Vapor Deposition (PVD), Metal Organic Chemical Vapor Deposition (MOCVD), Pulsed Laser Deposition (PLD), Atomic Layer Deposition (ALD) and other film growth techniques, Low Pressure Chemical Vapor Deposition (LPCVD), Plasma Enhanced Chemical Vapor Deposition (PECVD), High Density Plasma Chemical Vapor Deposition (HDPCVD), or various sputtering techniques. In one aspect of the present invention, the thickness of the etch stop layer 68 is between the range of about 500 Å to about 1000 Å.

Following the formation of the etch stop layer 68, an inter-level dielectric layer 70 (FIG. 10) is formed over the etch stop layer 68. The inter-level dielectric layer 70 can comprise silicon oxide formed using any suitable method including Any suitable technique for forming the inter-level dielectric layer 70 can be employed such as Physical Vapor Deposition (PVD), Metal Organic Chemical Vapor Deposition (MOCVD), Pulsed Laser Deposition (PLD), Atomic Layer Deposition (ALD) and other film growth techniques, Low Pressure Chemical Vapor Deposition (LPCVD), Plasma Enhanced Chemical Vapor Deposition (PECVD), High Density Plasma Chemical Vapor Deposition (HDPCVD), or various sputtering techniques.

Figure 10:
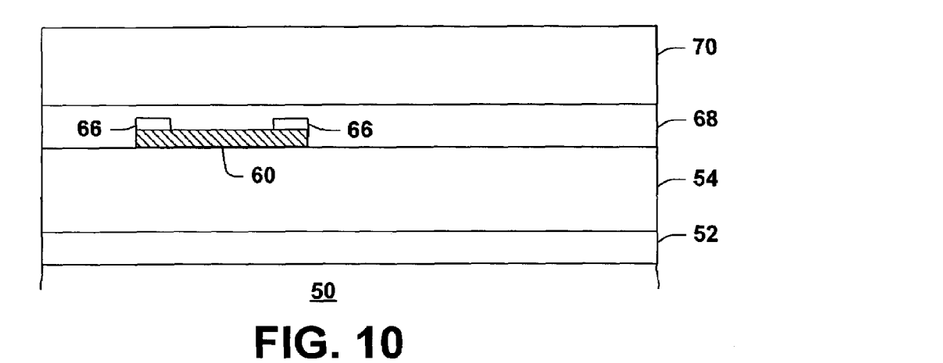
FIG. 10 illustrates a schematic cross-sectional illustration of the structure of FIG. 9 after deposition of an inter-level dielectric layer over the etch stop layer in accordance with an aspect of the present invention.

In one aspect of the invention, the inter-level dielectric layer 70 is formed using material from at least one of TEOS silicon oxides, PECVD silicon oxides, silicon nitrides, silicon oxynitrides, silicon carbides, spin-on glass (SOG) such as silsesquioxanes and siloxane, xerogels or any other suitable material. The inter-level dielectric layer 70 is planarized by a chemical mechanical polish (CMP). In one aspect of the present invention the thickness of the inter-level dielectric layer 70 is in the range from about 3000 Å to about 5000 Å. The thickness of the inter-level dielectric layer 70 is selected such that a subsequent laser trim process can be employed on the TFR 60 to trim the resistance value of the TFR 60 to a desired tolerance and value. The laser trim process is performed after fabrication of the semiconductor final structure.

After the formation of the inter-level dielectric layer 70, a patterned photoresist layer 72 (FIG. 11) is formed on the inter-level dielectric layer 70. The patterned photoresist layers 72 functions as an etch mask during the subsequent etching of vias and trenches in the dielectric layer 70. An etch 120 (FIG. 11) is performed on the inter-level dielectric layer 70 to form TFR vias 74 and 76 and a trench 78 in the inter-level dielectric layer 70. The etch 120 concurrently etches TFR vias 74 and the trench 76 in the inter-level dielectric layer 70. Although only a single TFR 60 and trench 78 are illustrated in the Figures, it is to be appreciated that the present invention can be used to form any number of trench and via structures in the dielectric layer in addition to the TFR vias. It should also be noted that a via is used in the present invention to describe a structure formed in a dielectric layer in which a contact is to be formed, and a trench is used to describe a structure formed in the dielectric layer in which a metal interconnect line is be formed.

Figure 11:
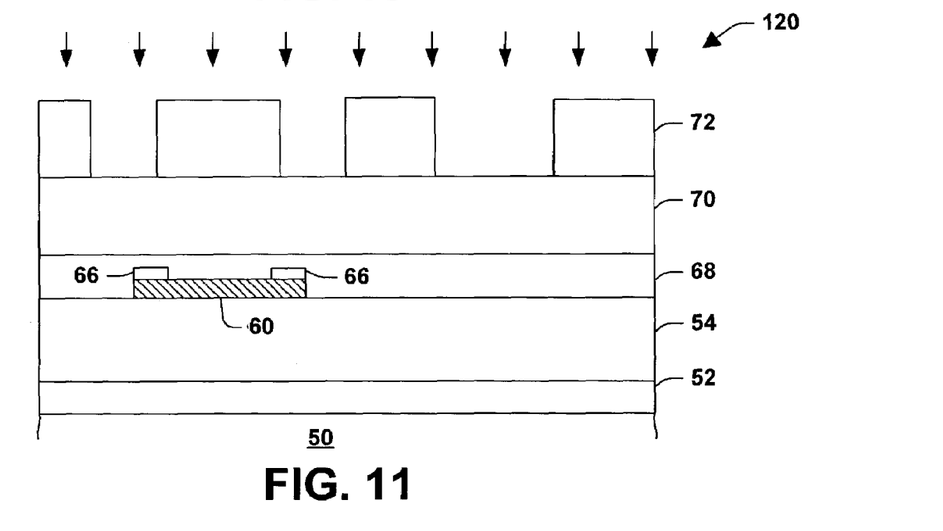
FIG. 11 illustrates a schematic cross-sectional illustration of the structure of FIG. 10 undergoing an etch step in accordance with an aspect of the present invention.

The etching of the inter-level dielectric layer 70 in FIG. 11 can be performed using a dry etch process that is designed to stop on the etch stop layer 68. For example, the inter-level dielectric layer 70 can be anisotropically etched with a plasma gas(es), such as carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer 72 to thereby create the TFR vias 74, 76 and the trench 78 in the inter-level dielectric layer 70.

Figure 12:
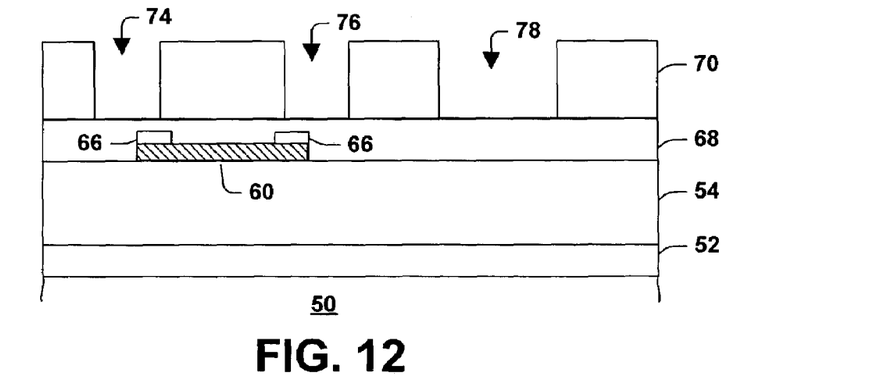
FIG. 12 illustrates a schematic cross-sectional illustration of the structure of FIG. 11 after the etch step is substantially complete in accordance with an aspect of the present invention.

For example, a selective etch technique can be used to etch the material of the inter-level dielectric layer 70 at a relatively greater rate as compared to the rate that the material of the patterned photoresist 72 is etched. Additionally, the selective etch technique is used to etch the inter-level dielectric layer 70 at a relatively greater rate than the underlying etch stop layer 68. In the case of a silicon oxide dielectric layer 70 and a silicon nitride etch stop layer 68, any dry etch process with high silicon oxide to silicon nitride selectivity can be employed. The resultant structure is illustrated in FIG. 12 after the remaining patterned photoresist 72 is stripped.

Figure 13:
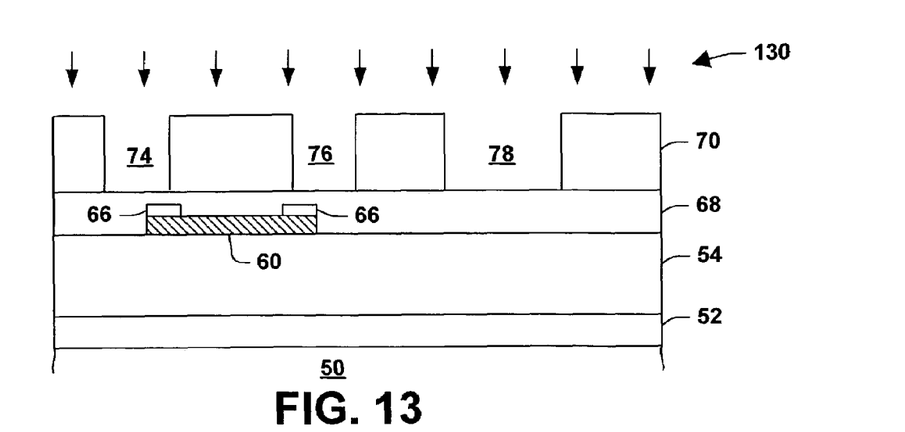
FIG. 13 illustrates a schematic cross-sectional illustration of the structure of FIG. 12 undergoing an etch step in accordance with an aspect of the present invention.

Turning now to FIG. 13, the etch stop layer 68 is shown undergoing an etching process 130 wherein the patterned inter-level dielectric layer 70 serves as a hard mask. The etching process 130 can be a dry etch or a wet etch, that is highly selective to the etch stop layer 68 with respect to the patterned inter-level dielectric layer 70. It is to be appreciated that any suitable etch methodology for selectively etching the etch stop layer 68 over the patterned inter-level dielectric layer 70 can be employed. The etching process 130 extends the TFR vias 74 and 76 and the trench 78 through at least a portion of the stop layer 68, such that the TFR vias 74 and 76 provide contact access to the TFR 60 and the trench 78 extends to the top surface of the inter-level dielectric layer 54.

It is to be appreciated that during the etching of the etch stop layer 68, the contact pads 66 will protect the regions of the TFR 60 that would have been exposed to the etch process. The etch process used should therefore also have a high selectivity between the etch stop layer 68 and the contact pads 66. The etched TFR vias 74 and 76 will be used to provide electrical contact to the TFR 60 and a metal interconnect conductive line will be formed in the trench structure 78.

Figure 14:
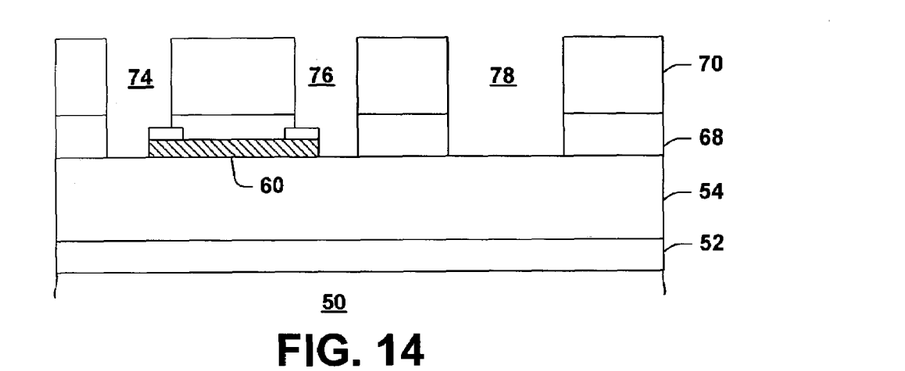
FIG. 14 illustrates a schematic cross-sectional illustration of the structure of FIG. 13 after the etch step is substantially complete in accordance with an aspect of the present invention.
Figure 15:
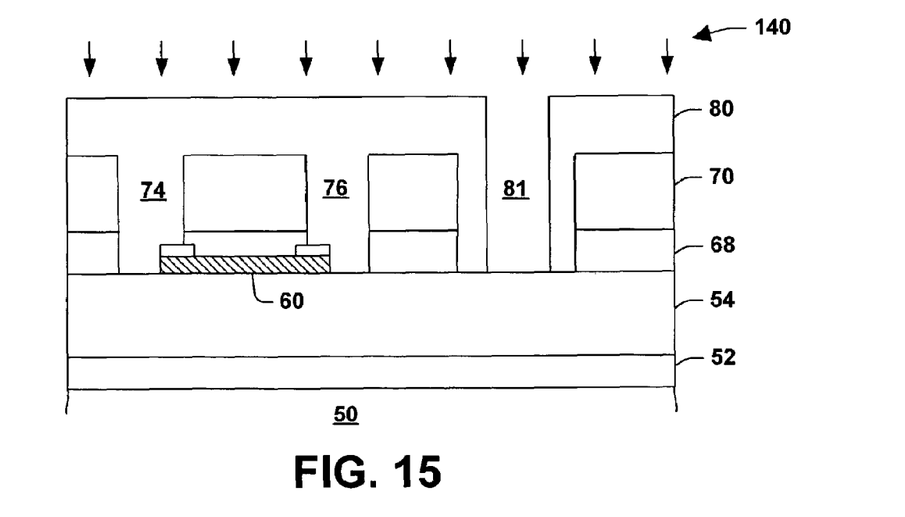
FIG. 15 illustrates a schematic cross-sectional illustration of the structure of FIG. 14 undergoing another etch step in accordance with an aspect of the present invention.
Figure 16:
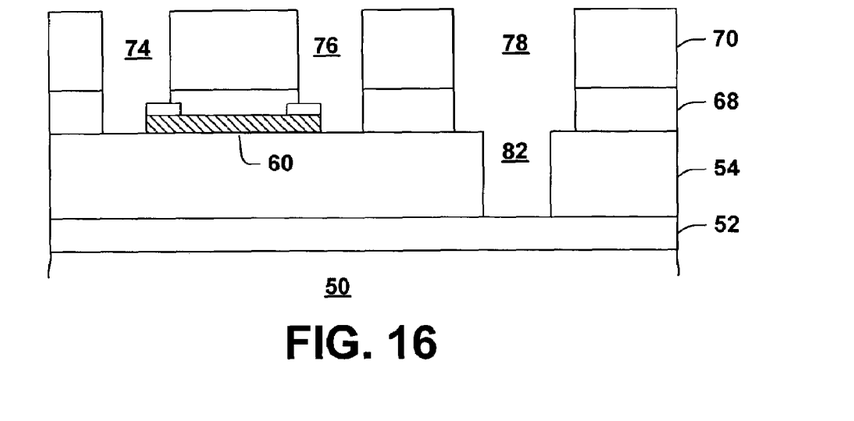
FIG. 16 illustrates a schematic cross-sectional illustration of the structure of FIG. 15 after the etch step is substantially complete in accordance with an aspect of the present invention.

Following the formation of the trench 78 and TFR vias 74 and 76 illustrated in FIG. 14, a patterned photoresist layer 80 (FIG. 15) is formed and used as a mask during the formation of a trench via 82 (FIG. 16). The trench via 82 is formed by etching from the top surface the underlying dielectric layer 54 to the conductive layer 52 through a patterned opening 81 in the photoresist layer 80 by an etch step 140. A selective etch technique can be used to etch the material of the inter-level dielectric layer 54 at a relatively greater rate as compared to the rate that the material of the patterned photoresist 80 and the underlying metal interconnect layer 52. The photoresist layer 80 is then stripped (e.g., ashing in an $O_2$ plasma) to remove remaining portions of the photoresist layer 80. The resultant structure is illustrated in FIG. 16.

Figure 17:
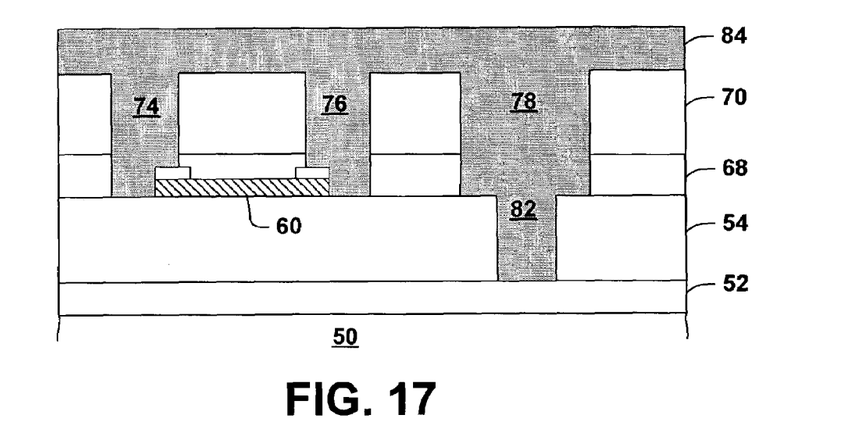
FIG. 17 illustrates a schematic cross-sectional illustration of the structure of FIG. 16 after undergoing a contact fill in accordance with an aspect of the present invention.
Figure 18:
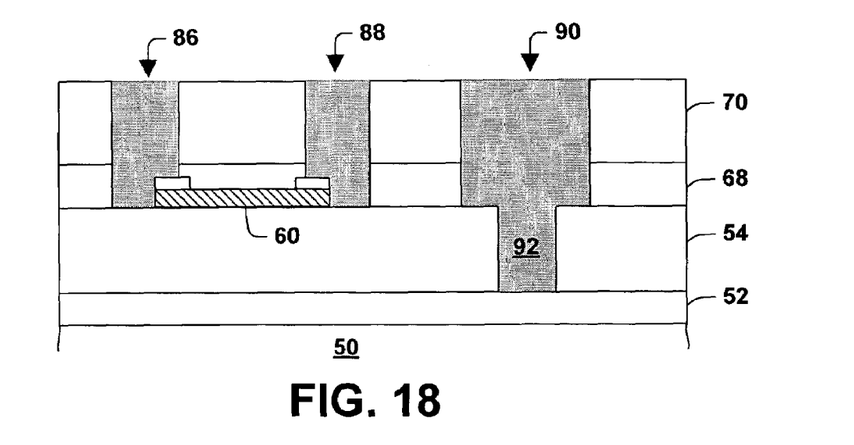
FIG. 18 illustrates a schematic cross-sectional illustration of the structure of FIG. 17 after undergoing a polishing step in accordance with an aspect of the present invention.

The TFR vias 74 and 76 and the trench 78 and trench via 82 are filled with a contact material (e.g., aluminum, aluminum alloy, copper, copper alloy, tungsten, tungsten alloy) as illustrated in FIG. 17, so as to form conductive contacts 86 and 88, conductive line 90 and trench contact 92 (FIG. 18). FIG. 18 illustrates a polished back step to remove a predetermined thickness of the contact material 84. The polish back step includes using a chemical mechanical polish that is selective to removing the contact material 84. The polished back step can be performed to remove an amount of the contact material 84 overlying the inter-level dielectric layer 70. Furthermore, the contact material 84 can be removed employing a metal etch process highly selective to the contact material 84 over the underlying inter-level dielectric layer 70. The resultant structure is illustrated in FIG. 18.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for forming a thin film resistor, comprising:
   forming a first dielectric layer over a metal interconnect layer;
   forming a thin film resistor on the first dielectric layer;
   forming contact pads on the thin film resistor;
   forming a second dielectric layer over the thin film resistor;
   concurrently forming at least one trench and thin film resistor vias in the second dielectric layer, wherein the thin film resistor vias provide access to the contact pads;
   forming a trench via in the at least one trench;
   filling the thin film resistor vias, the at least one trench and the trench via with a contact material layer; and
   forming an etch stop of silicon carbide,
   wherein said thin film resistor is formed directly under the etch stop of the silicon carbide.

2. The method of claim 1, the second dielectric layer formed from one of a TEOS silicon oxides, PECVD silicon oxides, silsesquioxanes, siloxane, and xerogels.

3. The method of claim 1, the thin film resistor formed from one of silicon chromium (SiCr) alloy, nickel chromium (NiCr) alloy, tantalum nitride, titanium nitride, and tungsten.

4. The method of claim 1, the thin film resistor having a thickness in the range from about 25 Å to about 300 Å.

5. The method of claim 1, the etch stop layer having a thickness in the range from about 500 Å to about 1000 Å.

6. The method of claim 4, the metal interconnect layer being formed on a semiconductor structure.

7. A method for forming a thin film resistor and conductive lines in an integrated circuit, the method comprising:
   forming a thin film resistor material layer on a first dielectric layer overlying a metal interconnect layer;
   etching away portions of the thin film resistor material layer to form a thin film resistor;
   forming contact pads on the thin film resistor;
   forming an etch stop layer of silicon carbide over the thin film resistor;
   forming a second dielectric layer over the etch stop layer;
   etching the second dielectric layer to the etch stop layer to concurrently form at least one trench and thin film resistor vias in the second dielectric layer, wherein the thin film resistor vias are positioned over the contact pads;
   etching at least a portion of the etch stop layer to expose portions of the first dielectric layer below the at least one trench and to expose end portions of the thin film resistor;

filling the thin film resistor vias, the at least one trench and the trench via with a contact material layer; and polishing back the contact material layer to remove an amount of the contact material layer overlying the second dielectric layer;

wherein said thin film resistor is formed directly under the etch stop of silicon carbide.

8. The method of claim 7, the metal contact layer being disposed over a semiconductor substrate.

9. The method of claim 7, the thin film resistor formed suing one of silicon chromium (SiCr) alloy, nickel chromium (NiCr) alloy, tantalum nitride, titanium nitride, and tungsten.

10. The method of claim 7, the thin film resistor having a thickness in the range from about 25 Å to about 300 Å.

11. The method of claim 7, the etch stop layer having a thickness in the range from about 500 Å to about 1000 Å.

12. An integrated circuit having at least one thin film resistor and at least one conductive line coupled to a metal interconnect layer, the integrated circuit comprising:

a first dielectric layer disposed over a metal interconnect layer;

a thin film resistor disposed over the first dielectric layer;

a first contact pad disposed on a first end of the thin film resistor and a second contact pad disposed on a second end of the thin film resistor;

a second dielectric layer disposed over the thin film resistor;

a first thin film resistor contact that extends from a surface of the second dielectric layer to the first end of the thin film resistor;

a second thin film resistor contact that extends from the surface of the second dielectric layer to the second end of the thin film resistor;

a trench contact that extends from the metal interconnect layer to a surface of the first dielectric layer;

a trench filled conductive line coupled to the trench contact, the trench filled conductive line extends from the surface of the second dielectric layer to the surface of the first dielectric layer, wherein openings for the trench filled conductive line and the first and second thin film resistor contacts are formed concurrently; and an etch stop of silicone carbide, wherein said thin film resistor is formed directly under the etch stop of the silicon carbide.

13. The integrated circuit of claim 12, the thin film resistor formed from one of silicon chromium (SiCr) alloy, nickel chromium (NiCr) alloy, tantalum nitride, titanium nitride, and tungsten.

14. The integrated circuit of claim 12, the thin film resistor having a thickness in the range from about 25 Å to about 300 Å.

* * * * *